(12) United States Patent
Fukumasu et al.

(10) Patent No.: US 9,345,160 B2
(45) Date of Patent: May 17, 2016

(54) ELECTRONIC DEVICE

(71) Applicant: Hitachi Automotive Systems, Ltd., Hitachinaka-shi, Ibaraki (JP)

(72) Inventors: Keisuke Fukumasu, Tokyo (JP); Akihiro Namba, Tokyo (JP); Hidenori Shinohara, Hitachinaka (JP)

(73) Assignee: Hitachi Automotive Systems, Ltd., Hitachinaka-shi, Ltd ( * ) Notice: Subject to any disclaimer, the term of this patent is extended or adjusted under 35 U.S.C. 154(b) by 128 days.

(21) Appl. No.: 14/352,179

(22) PCT Filed: Oct. 26, 2012

(86) PCT No.: PCT/JP2012/077673
§ 371 (c)(1),
(2) Date: Apr. 16, 2014

(87) PCT Pub. No.: WO2013/065586
PCT Pub. Date: May 10, 2013

(65) Prior Publication Data
US 2014/0240946 A1    Aug. 28, 2014

(30) Foreign Application Priority Data
Oct. 31, 2011  (JP) .................................. 2011-238187

(51) Int. Cl.
*H05K 5/00* (2006.01)
*H05K 7/00* (2006.01)
(Continued)

(52) U.S. Cl.
CPC .............. *H05K 7/02* (2013.01); *B60L 11/1816* (2013.01); *B60L 11/1868* (2013.01);
(Continued)

(58) Field of Classification Search
CPC ................. G06F 1/16; G06F 1/1601–1/1611; G06F 1/1613–1/1698; G06F 1/18–1/189; G06F 1/181–1/182; H05K 5/00–5/069; H05K 7/00–7/186; H05K 7/20218–7/20381; H05K 7/20409–7/20418; H05K 7/20009–7/202; H01L 23/367–23/3677; H01L 23/473; H01L 23/46–23/467

USPC .......... 361/679.01–679.45, 679.55–679.61, 361/679.26–679.3, 679.31–679.39, 361/679.55–679.56, 679.21, 676–678, 361/679.46–679.54, 688–727; 165/80.1–80.5, 104.33, 185; 174/15.1–15.3, 16.1–16.3, 547, 548; 257/712–722, E23.088; 348/787, 789, 348/794; 349/56–60
See application file for complete search history.

(56) References Cited

U.S. PATENT DOCUMENTS 5,546,273 A * 8/1996 Harris ..................... B60R 11/02
                                                            361/697

(Continued)

FOREIGN PATENT DOCUMENTS

| JP | 1-218115 A | 8/1989 |
| JP | 5-328710 A | 12/1993 |

(Continued)

OTHER PUBLICATIONS

International Search Report dated Feb. 12, 2013 w/ English translation (four (4) pages).

*Primary Examiner* — Anthony Haughton
*Assistant Examiner* — Razmeen Gafur
(74) *Attorney, Agent, or Firm* — Crowell & Moring LLP

(57) ABSTRACT

Provided is an electronic device that is provided with a filter circuit that suppresses the effects of electromagnetic noise propagated through space from a circuit board and reduces parasitic inductance, and can output a voltage with adequately reduced noise. To solve the above problem, in an electronic device provided with a cabinet (101), a circuit board (132) provided in the cabinet, an output terminal (122) that passes through a through hole provided in the cabinet and outputs the output of the circuit board to the outside, the present invention constructs a loop composed of a filter means (142) having a filter capacitor (142a), an output terminal, a cabinet, and wires (142b, 142c) for connecting these parts. The wire (142c) connected to the cabinet is connected to a position close to the output terminal, and reduces the size of the loop. In addition, a shield (102) is provided between the filter means and the circuit board.

19 Claims, 10 Drawing Sheets

(51) Int. Cl.
  *H05K 7/02* (2006.01)
  *B60L 11/18* (2006.01)
  *H03H 7/01* (2006.01)
  *G06F 1/16* (2006.01)

(52) U.S. Cl.
  CPC ......... *H03H 7/0115* (2013.01); *B60L 2200/26* (2013.01); *B60L 2210/10* (2013.01); *B60L 2210/12* (2013.01); *B60L 2210/14* (2013.01); *Y02T 10/7005* (2013.01); *Y02T 10/7066* (2013.01); *Y02T 10/7072* (2013.01); *Y02T 10/7216* (2013.01); *Y02T 10/7225* (2013.01); *Y02T 10/7233* (2013.01); *Y02T 90/127* (2013.01); *Y02T 90/14* (2013.01)

(56) References Cited

U.S. PATENT DOCUMENTS

| | | | | |
|---|---|---|---|---|
| 6,279,336 | B1* | 8/2001 | Grundl | H01L 23/427 165/104.27 |
| 6,384,492 | B1* | 5/2002 | Iversen | H01L 23/467 257/691 |
| 6,650,559 | B1* | 11/2003 | Okamoto | H01L 23/3672 257/E23.103 |
| 6,849,943 | B2* | 2/2005 | Thurk | H02M 1/44 257/675 |
| 7,016,192 | B2* | 3/2006 | Beihoff | B60L 11/12 257/714 |
| 7,026,664 | B2* | 4/2006 | Divakar | H01L 23/3677 174/252 |
| 7,952,879 | B1* | 5/2011 | Vinciarelli | H05K 7/209 165/185 |
| 8,743,548 | B2* | 6/2014 | Tokuyama | H02M 7/003 257/706 |
| 2002/0054480 | A1* | 5/2002 | Jitaru | H01F 27/06 361/704 |
| 2002/0071252 | A1* | 6/2002 | Kodaka | H05K 1/0203 361/704 |
| 2003/0067749 | A1* | 4/2003 | Tamba | H05K 7/20927 361/699 |
| 2004/0012926 | A1* | 1/2004 | Wanes | H05K 1/0263 361/715 |
| 2004/0246662 | A1* | 12/2004 | Thurk | H02M 1/44 361/631 |
| 2005/0270745 | A1* | 12/2005 | Chen | H01F 27/2804 361/707 |
| 2006/0039127 | A1* | 2/2006 | West | H02M 7/003 361/803 |
| 2007/0165376 | A1* | 7/2007 | Bones | H01L 25/162 361/688 |
| 2007/0253164 | A1* | 11/2007 | Matsuo | H01L 23/473 361/699 |
| 2009/0231811 | A1* | 9/2009 | Tokuyama | H01L 23/36 361/699 |
| 2010/0165577 | A1* | 7/2010 | Tokuyama | H02M 7/003 361/717 |
| 2010/0254093 | A1* | 10/2010 | Oota | B60R 16/0239 361/720 |
| 2010/0321889 | A1* | 12/2010 | Yoshino | H05K 7/202927 361/702 |
| 2011/0044009 | A1* | 2/2011 | Fukuda | H01L 21/565 361/720 |
| 2011/0051371 | A1* | 3/2011 | Azuma | B60K 6/445 361/699 |
| 2011/0069455 | A1* | 3/2011 | Tokuyama | H01L 23/473 361/702 |
| 2011/0128707 | A1* | 6/2011 | Rozman | H01L 23/24 361/709 |
| 2011/0194249 | A1* | 8/2011 | Nakasaka | H01L 23/473 361/689 |

FOREIGN PATENT DOCUMENTS

| | | |
|---|---|---|
| JP | 2001-54286 A | 2/2001 |
| JP | 2006-180578 A | 7/2006 |
| JP | 2009-177998 A | 8/2009 |
| JP | 2009-254118 A | 10/2009 |
| JP | 2011-50160 A | 3/2011 |
| JP | 2011-103248 A | 5/2011 |

* cited by examiner

ELECTRONIC DEVICE

TECHNICAL FIELD

The present invention relates to noise filters in an electronic device that performs power conversion and the like.

BACKGROUND ART

An electric vehicle and/or a plug-in hybrid vehicle have mounted thereon an inverter device that drives a motor with a high-voltage battery for power drive and a low-voltage battery for operating auxiliary machines, such as a light and a radio of the vehicle. Such a vehicle has mounted thereon a DC/DC converter device (power conversion device) that performs the power conversion from a high-voltage battery to a low-voltage battery or the power conversion from a low-voltage battery to a high-voltage battery.

Some power conversion devices have coupled thereto filter circuits, such as an input filter circuit on the input side of a power conversion circuit and an output filter circuit on the output side of the power conversion circuit, as one of the purposes for reducing noise that mixes into an electronic device and the like arranged outside the power conversion device (e.g., see Patent Literature 1).

CITATION LIST

Patent Literature

Patent Literature 1 JP-2004-368388

SUMMARY OF INVENTION

Technical Problem

In an input filter circuit and an output filter circuit coupled to a power conversion device, the parasitic inductance of the filter circuit might increase and the noise radiated from a power conversion circuit and propagating in space and/or the electromagnetic noise caused by an eddy current flowing in a housing might be superimposed on the filter circuit, so that the electromagnetic induction might degrade the filter performance.

The present invention has been made in order to solve the above-described problem, and provides an electronic device that reduces noise radiated from a circuit and thereby secures the noise reduction effect of a filter.

Solution to Problem

In order to solve the above-described problem, the present invention employs the configurations defined by the appended claims. According to an aspect of the present invention, an electronic device includes: a housing; a circuit board provided in the housing; and an external terminal for outputting an output of the circuit board to an outside or for entering the circuit board from an outside, the external terminal extending through a through-hole provided in the housing, wherein a filter unit with a filter capacitor, the external terminal, the housing, and wirings for couples these parts constitute a loop, and wherein a wiring coupled to the housing is coupled to a position close to the external terminal so as to reduce the loop.

Advantageous Effects of Invention

According to an aspect of the present invention, spatially-coupling of the noise from a circuit board to a filter unit and the like can be suppressed and thereby the noise reduction effect of the filter can be secured.

DESCRIPTION OF EMBODIMENTS

Hereinafter, embodiments of the present invention will be described with reference to the accompanying drawings.

Figure 1:
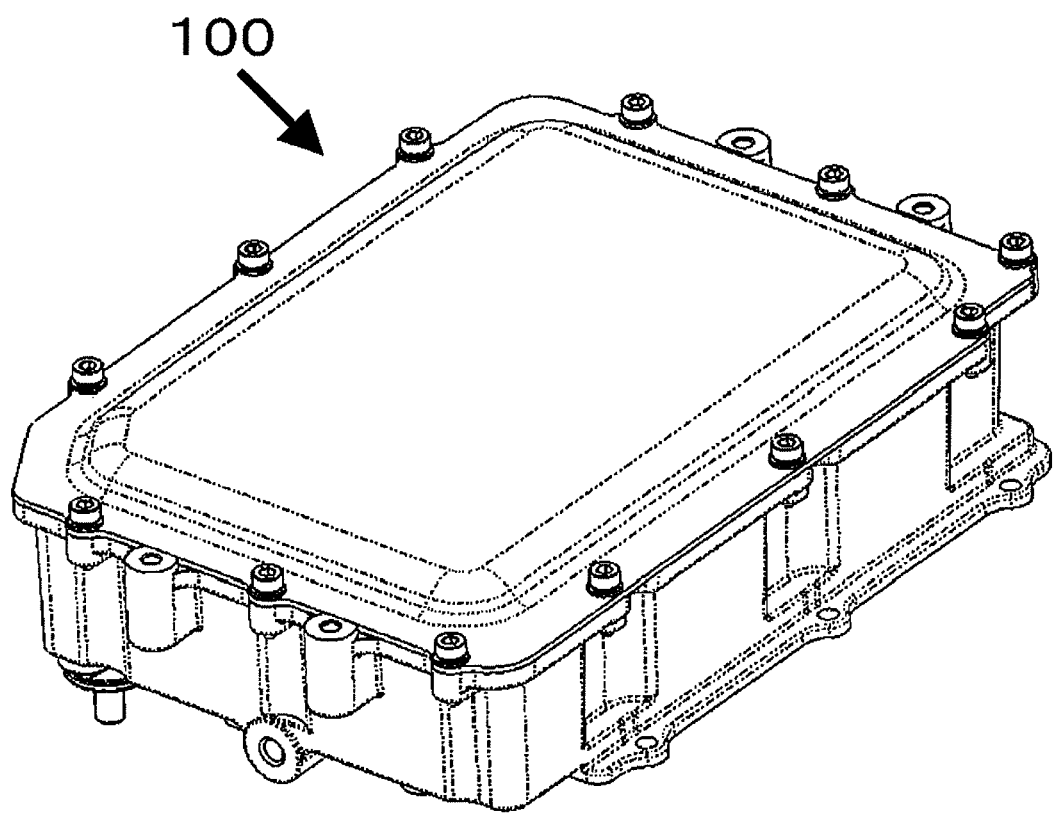
FIG. 1 is an external perspective view of a DC/DC converter device according to an embodiment of the present invention.

FIG. 1 is a perspective view illustrating an external view of a DC/DC converter device 100. The DC/DC converter device is applied to an electric vehicle and the like, and performs the power conversion from a high-voltage battery to a low-voltage battery or the power conversion from a low-voltage battery to a high-voltage battery.

Figure 2:
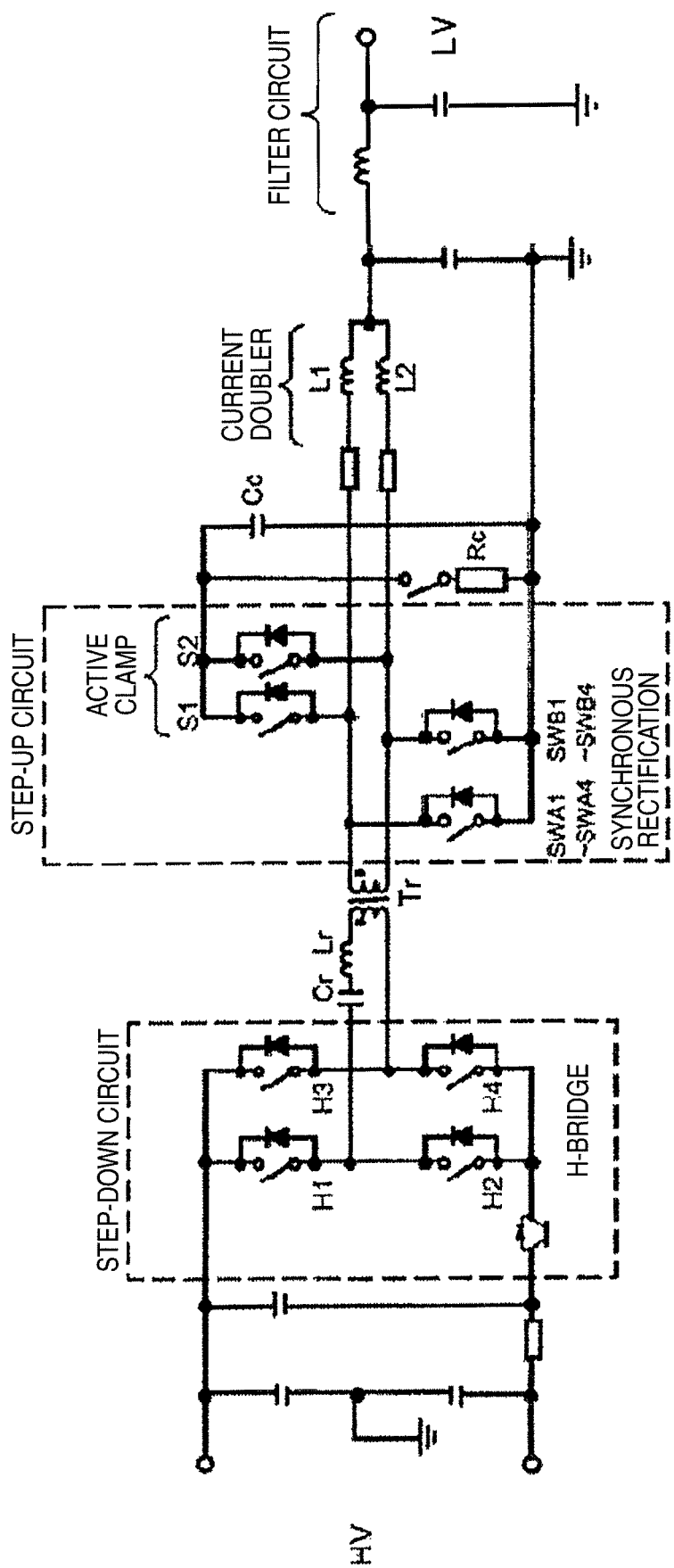
FIG. 2 is a view illustrating the circuit configuration of the DC/DC converter device according to the embodiment of the present invention.

The DC/DC converter device 100 is described. FIG. 2 is a view illustrating the circuit configuration of the DC/DC converter device 100. As illustrated in FIG. 2, the DC/DC converter device 100 of the embodiment corresponds to a bidirectional DC/DC converter device. Therefore, a step-down circuit and a step-up circuit employ a synchronous rectification configuration instead of a diode rectification configuration. Moreover, in order to obtain a high output power by HV (High Voltage)/LV (Low Voltage) conversion, high-current components are employed for switching elements to increase the size of a smoothing coil.

Specifically, both the HV side and the LV side employ an H-bridge type synchronous rectification switching circuit configuration (H1-H4) using a MOSFET with a recovery diode. In switching control, zero-cross switching is achieved at a high switching-frequency (100 kHz) using a LC series resonant circuit (Cr, Lr), so as to improve the conversion efficiency and thereby reduce the heat loss. In addition, an active clamp circuit is provided so as to reduce the loss due to a circulating current during the step-down operation, and furthermore the occurrence of a surge voltage during switching is suppressed so as to reduce the breakdown voltage of the switching elements, thereby achieving a reduction in the breakdown voltage of the circuit components and miniaturizing the DC/DC converter device.

Furthermore, in order to secure a high output power on the LV side, a full-wave rectification type current doubler scheme is employed. Note that, in achieving an increase in output power, a high output power is secured by simultaneously activating a plurality of switching elements in parallel. In the example of FIG. 2, four switching elements are arranged in parallel, like SWA1-SWA4 and SWB1-SWB4. Moreover, an increase in output power is achieved by arranging two circuits of switching elements and small-sized reactors, i.e., smoothing reactors, (L1, L2) in parallel so as to have symmetry. By arranging two circuits of small-sized reactors in this manner, miniaturization of the entire DC/DC converter device can be achieved as compared with the case of arranging one large-sized reactor.

Figure 3:
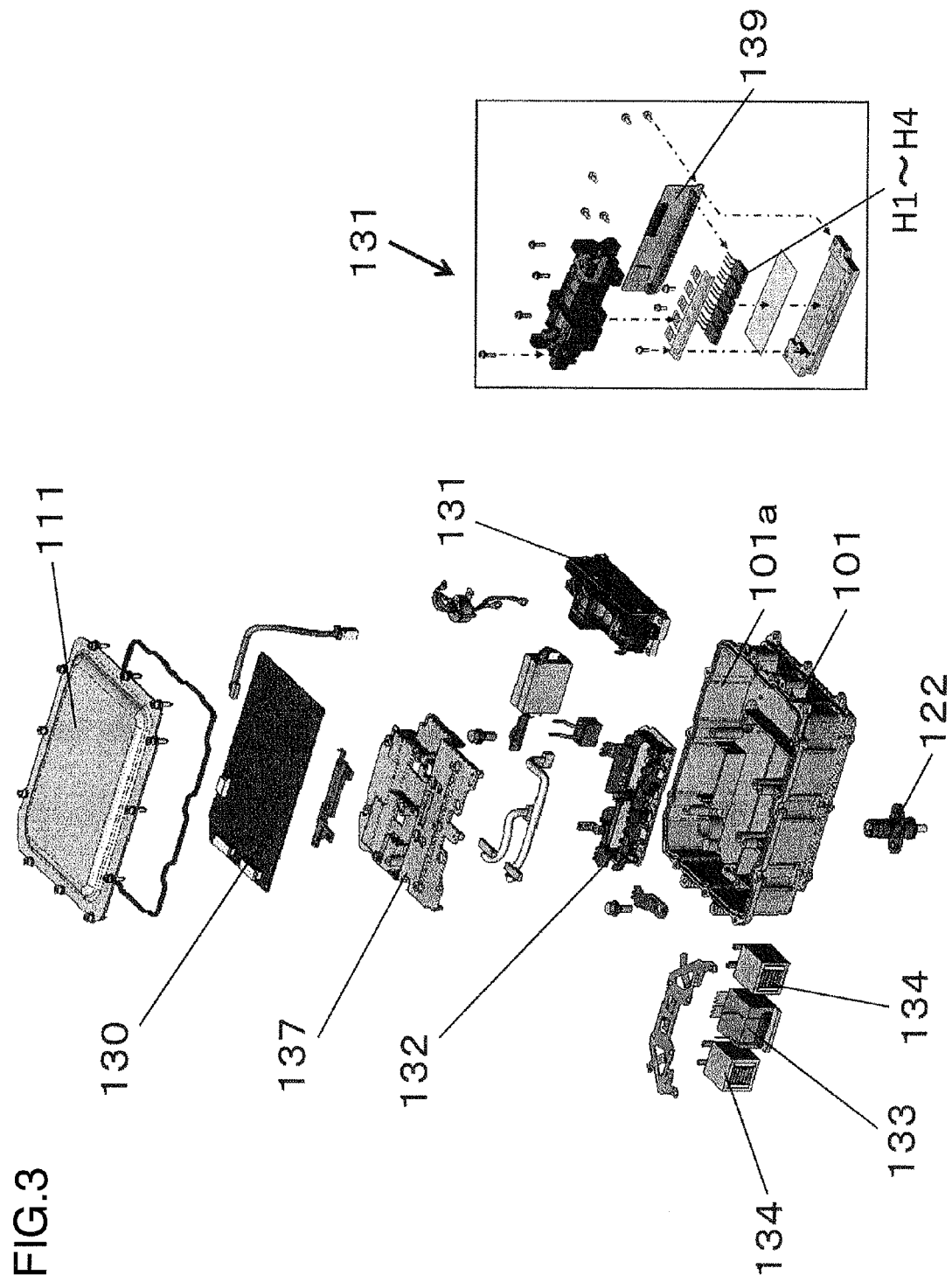
FIG. 3 is an exploded view illustrating the component arrangement in the DC/DC converter device according to the embodiment of the present invention.
Figure 4:
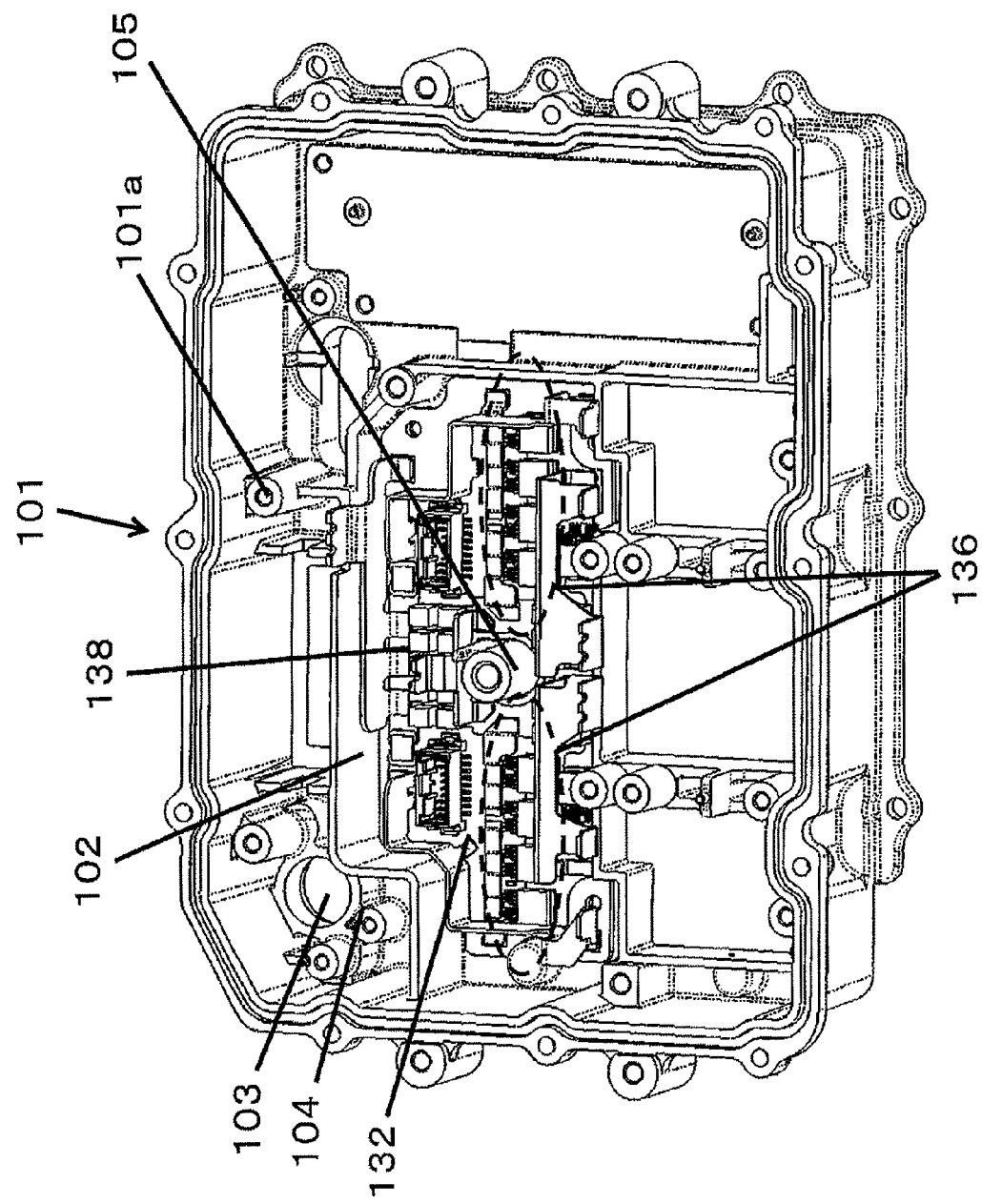
FIG. 4 is a perspective view illustrating the component arrangement in a housing of the DC/DC converter device according to the embodiment of the present invention.
Figure 5:
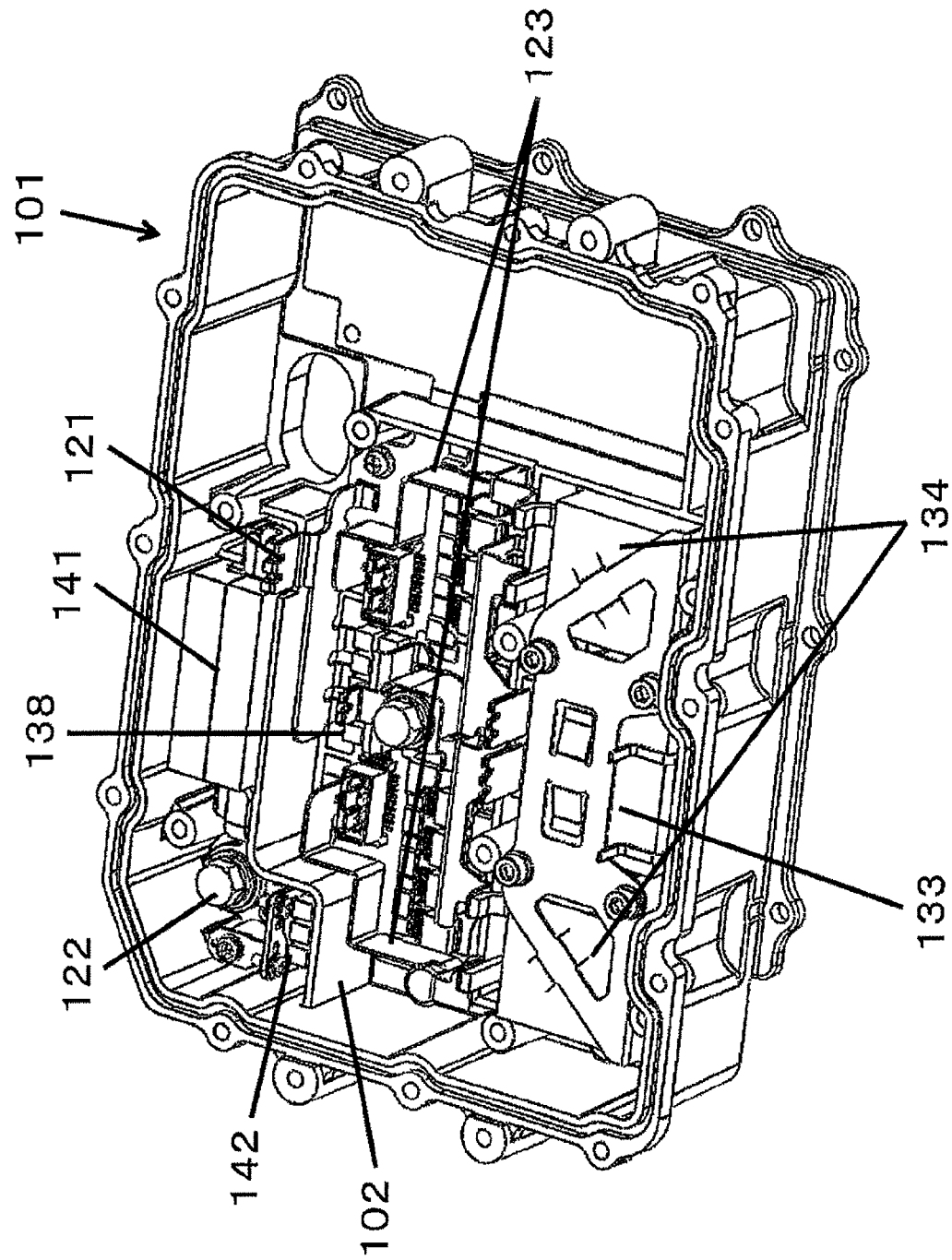
FIG. 5 is a perspective view illustrating the component arrangement in the housing of the DC/DC converter device according to the embodiment of the present invention, and an external view of an output bus bar and output terminal for outputting the output of a step-up circuit board to the outside and a filter circuit comprising a ferrite and a capacitor substrate.

FIGS. 3, 4, and 5 are views illustrating the component arrangement in the DC/DC converter device 100. FIG. 3 is an exploded perspective view of the DC/DC converter device 100.

As illustrated in FIG. 3, the circuit components of the DC/DC converter device 100 are housed in a metal (e.g., aluminum die-cast) housing 101. A case cover 111 is fixed to the opening of the housing 101 with a volt. A main transformer 133, an inductor element 134, a step-down circuit section 131 having switching elements H1-H4 mounted thereon, a step-up circuit section 132 having a switching element 136 mounted thereon, and the like are placed in the bottom surface section inside the housing 101.

Note that, for the correspondence with the circuit diagram of FIG. 2, the main transformer 133 corresponds to a transformer Tr, the inductor element 134 corresponds to the reactors L1 and L2 of the current doubler, and the switching element 136 corresponds to the switching element SWA1-SWA4 and SAWB1-SWB4, respectively. The switching elements S1, S2, and the like of FIG. 2 are also mounted on the step-up circuit section 132.

The switching elements H1-H4 are provided inside the step-down circuit section 131. The switching elements H1-H4 are mounted on a metal substrate 139 having patterns formed therein, and the back side of the metal substrate is fixed to the housing bottom surface so as to closely contact thereto. The step-up circuit section 132, on which the switching element 136 is mounted, also comprises a metal substrate similarly.

A control circuit that controls the switching elements provided in the step-up circuit section 132 and in the step-down circuit section 131 is mounted on the control circuit board 130. The control circuit board 130 is fixed onto a metal base plate 137. The base plate 137 is fixed by a plurality of supports 101a projecting upward from the bottom surface of the housing 101. Thus, the control circuit board 130 will be arranged above the heat generating components (the main transformer 133, the inductor element 134, and the like) arranged in the housing bottom surface section, via the base plate 137.

Because the base plate 137 is formed of metal, the heat generated in the control circuit board 130 is transferred to the support 101a and the housing 101. Moreover, the base plate 137 functions as a shielding member for radiation heat from the heat generating components provided in the housing bottom surface section, and also functions as a shield that shields the switching radiation noise from the switching elements by using copper material and the like.

Figure 6:
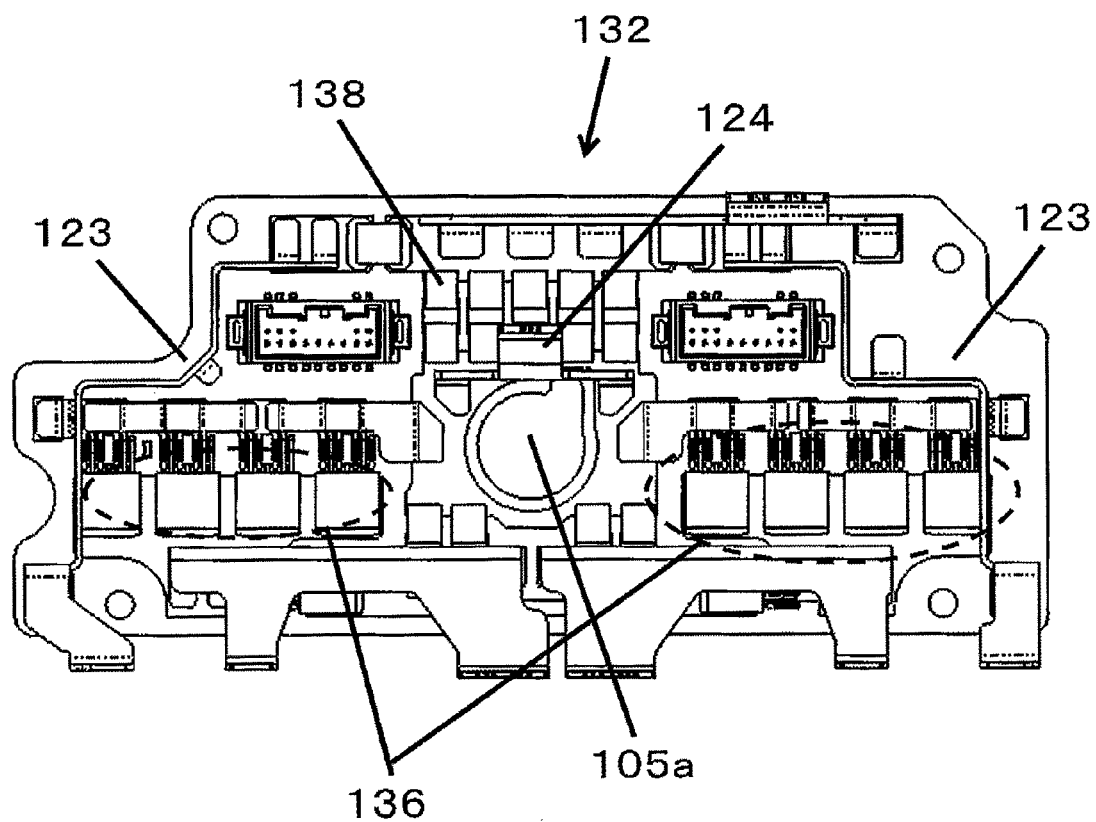
FIG. 6 is a view illustrating the component arrangement of a step-up circuit section according to the embodiment of the present invention.

FIG. 4 is a perspective view illustrating the component arrangement of the step-up circuit section 132 in the DC/DC converter device 100 and an external view of the housing (case) 101. FIG. 5 is a perspective view illustrating the component arrangement of the step-up circuit section 132 in the DC/DC converter device 100, and an external view of an output bus bar 121 and output terminal 122 for outputting the output of the step-up circuit section 132 to the outside, and the LC filter circuit comprising a ferrite core 141 and an output filter 142. FIG. 6 is a plan view of the step-up circuit section 132.

The ferrite core 141 and the output filter 142 constitute the LC filter circuit that is installed in order to reduce the output noise of the DC/DC converter device 100, and constitutes a π-type LC filter circuit together with the smoothing capacitor 138 mounted on the substrate of the step-up circuit section 132. Note that the circuit configuration is intended to reduce noise in the output and therefore is not limited to the π-type LC filter circuit. The output terminal 122 functions as an output terminal in converting the power from the HV side to the LV side, while in converting the power from the LV side to the HV side, it functions as an input terminal. While the converter of the embodiment is capable of performing power conversion in both directions, i.e., to the HV side and to the LV side, there is also a converter that performs power conversion in only one direction.

Between the LC filter circuit and the step-up circuit section 132, a shield wall 102 formed integrally with the housing 101 is formed. The output bus bar 121 bypasses the shield wall 102, and electrically couples the step-up circuit section 132, the ferrite core 141, the output filter 142, and the output terminal 122. With the shield wall 102, as illustrated in FIG. 5, even when the LC filter circuit, the step-down circuit section 131, and the step-up circuit section 132 are inside one and the same housing of the housing 101, it is possible to prevent the switching radiation noise due to the switching elements of the step-down circuit section 131 and the step-up circuit section 132 from being superimposed on the LC filter circuit and prevent the noise reduction effect of the filter from being unable to be obtained. Accordingly, there is no need to prepare a separate housing for the LC filter circuit.

At least if the output terminal 122, in which the current whose noise is removed by the LC filter circuit flows, is isolated by the shield wall 102 from the step-up circuit section 132 and the like, the shield effect can be obtained. However, preferably, shielding also the output filter 142 and the ferrite core 141 with the shield wall 102 would further increase the shielding distance near the output terminal 122 and thus further increase the shielding effect. Note that, in the embodiment, the smoothing capacitor 138 is situated at a position branched from the path from the step-up circuit section 132 to the output terminal 122. Therefore, even if the smoothing capacitor 138 is shielded, the effect is small, and furthermore because the smoothing capacitor 138 is provided on the board of the step-up circuit section 122, the smoothing capacitor 138 is not an object to be shielded with the shield wall 102.

Moreover, using a conductive seal material in order to fill the gap between the shield wall 102 and the case cover 111, the shield effect can be increased further.

Note that the shield wall 102 may be formed integrally with the base plate 137. In this case, because the base plate 137 is fixed to the housing 101 with a screw (not shown), the position of the screw is the most potentially-stable position in the base plate 137. Therefore, in the case where the shield wall 102 is formed from the base plate 137, a screw hole is preferably installed close to the shield wall 102.

The shield wall 102 is preferably formed from both the housing 101 and the base plate 137. By installing the shield wall 102 and the shield wall of the base plate 107 so as to intersect with each other when seen from the housing, the distance of the LC filter circuit from the step-down circuit section 131 and the step-up circuit section 132 that are noise sources can be increased, the noise to be mixed can be reduced, and the shield effect can be increased.

Note that, in the embodiment, as illustrated in FIG. 4, the DC/DC converter device 100 includes the output terminal 122 for outputting the output of the step-up circuit section 132 to the outside, the output terminal 122 extending through the through-hole 103 provided from the housing 101. In the periphery of the through-hole 103, a projection 104 is formed so as to cover the output terminal, where the housing is thickened. Thus, even if noise is spatially superimposed between the filter circuit and the through-hole 103, the noise can be prevented from leaking to the outside.

Moreover, as illustrated in FIGS. 4, 5, and 6, a GND boss 105 and a GND boss installing hole 105a are arranged in the center of the step-up circuit section 132. Thus, bus bars 123 on the board of the step-up circuit section 132 arranged between two inductor elements 134 for voltage conversion and the smoothing capacitor 138 can be symmetrically arranged, and the values of the parasitic inductance of the respective bus bars 123 can be set equal. Accordingly, the loss can be reduced.

Because the chassis of a vehicle usually the largest conductor inside the vehicle, in a vehicle with a DC/DC converter the housing 101 coupled to the chassis is most potentially-stable. Therefore, one end of the smoothing capacitor 138 is coupled to GND (ground), and by installing the GND boss 105 very close to this place, the parasitic inductance between the smoothing capacitor 138 and GND can be minimized. Thus, the noise reduction effect of the smoothing capacitor 138 can be secured.

Moreover, the GND boss 105 is installed in proximity to the smoothing capacitor 138, so that there is no need for the GND bus bar 124, which couples the smoothing capacitor 138 and the GND boss 105, to be installed running in parallel to the bus bar 123. It is therefore possible to prevent the switching noise from the bus bar 123 from electromagnetically coupling to the GND bus bar 124. Accordingly, potential fluctuations of the housing 101 can be prevented and the noise level of the DC/DC converter device 100 can be reduced.

Figure 7:
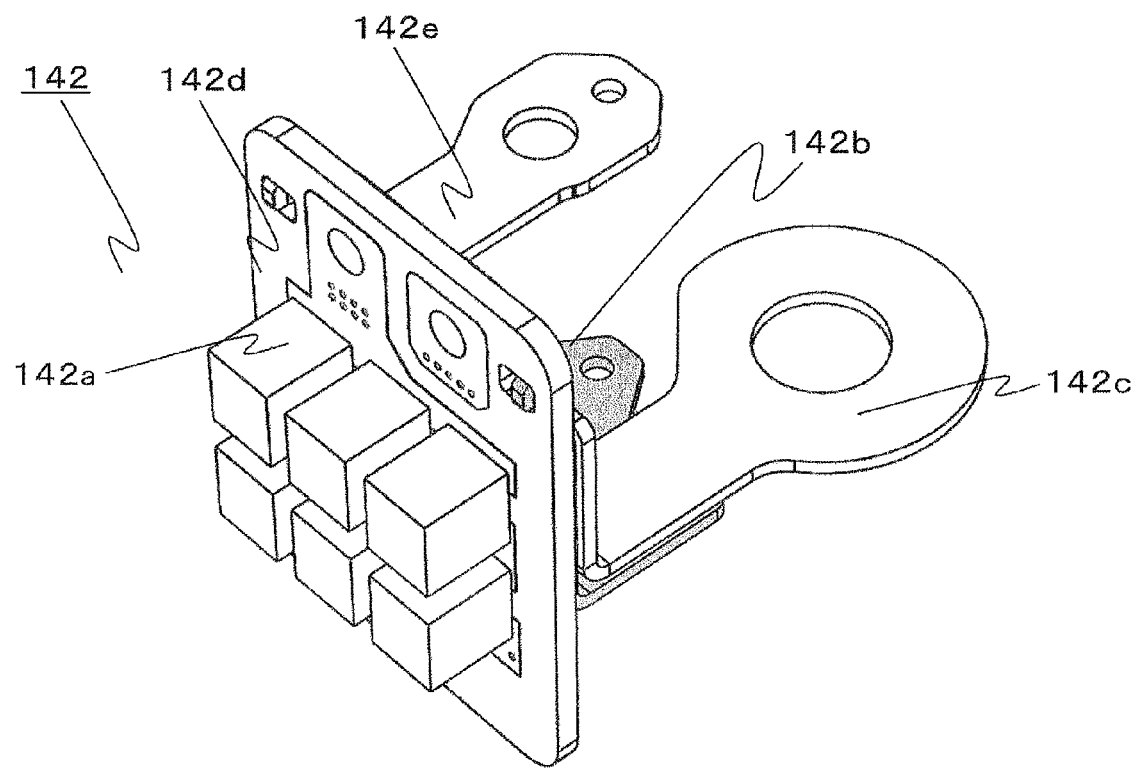
FIG. 7 is a perspective view illustrating the component arrangement of an output filter according to the embodiment of the present invention.
Figure 8:
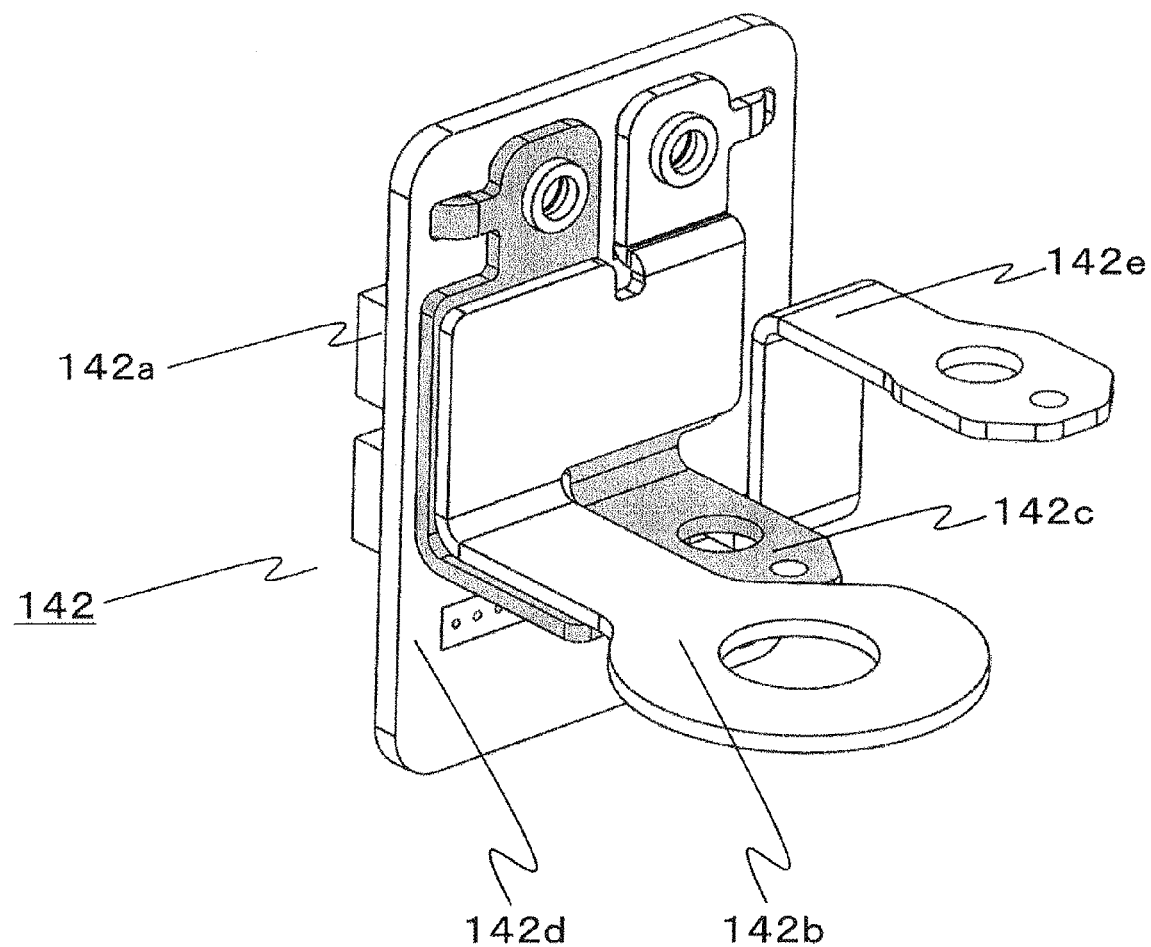
FIG. 8 is a perspective view illustrating the component arrangement of the output filter according to the embodiment of the present invention.

FIG. 7 and FIG. 8 are the perspective views illustrating an external view of the output filter 142. Ceramic capacitors 142a are mounted on a filter substrate 142d. The filter substrate 142d includes a filter output bus bar 142b for electrically coupling the capacitor 142a and the output terminal 122, a GND bus bar 142C for electrically coupling the capacitor 142a and the housing 101, and a fixture 142e for mechanically fixing the filter substrate 142d to the housing 101.

Figure 9:
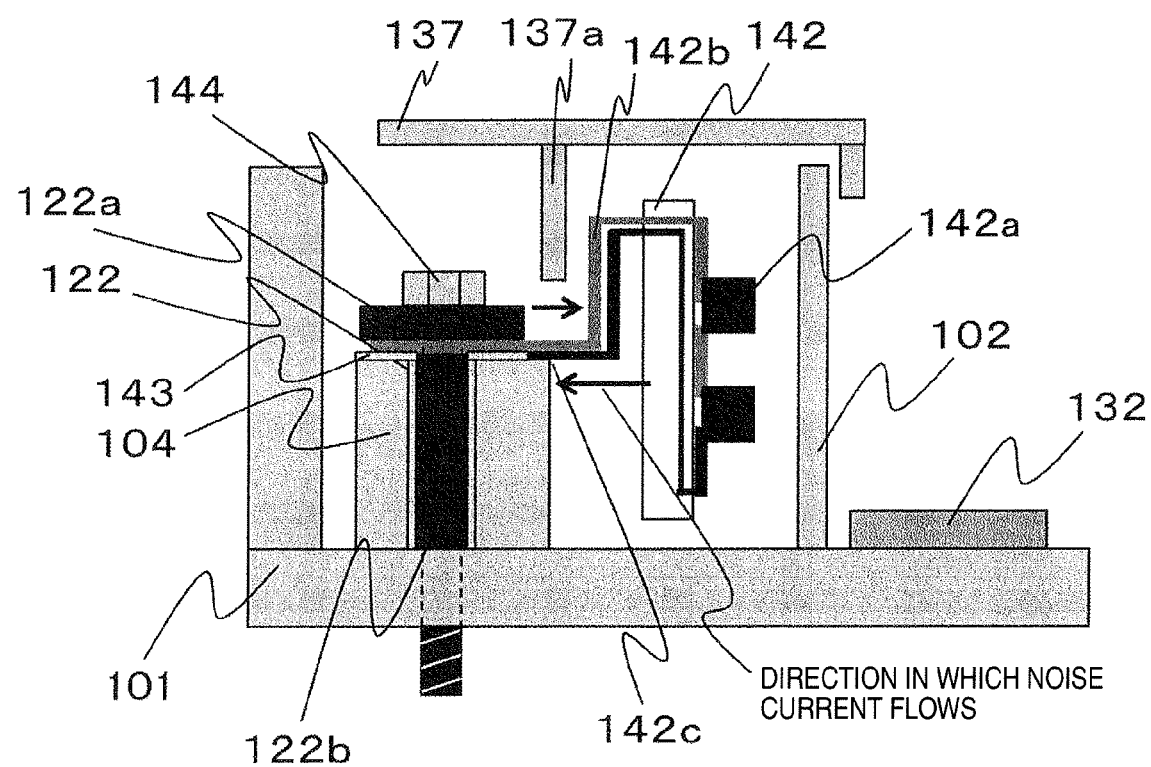
FIG. 9 is a cross sectional view illustrating the connection between the output filter and the output terminal according to the embodiment of the present invention.

FIG. 9 is a cross sectional view illustrating the connection between a capacitor substrate 142 and the output terminal 122. The arrows in the view each indicate the direction in which a noise current flowing into the filter circuit flows.

As illustrated in FIG. 9, the filter output bus bar 142b and the GND bus bar 142C are arranged so as to face in proximity to each other. This enables to reduce the area of a loop formed by the filter output bus bar 142b, the filter base plate 142, and the GND bus bar 142C. Therefore, the superposition of switching noise from the step-down circuit section 131 and/or the step-up circuit section 132 can be reduced.

As illustrated in FIG. 9, the output terminal 122 and the filter substrate 142d are coupled via the filter output bus bar 142b and the GND bus bar 142C. Moreover, in order to fix, to the housing 101, the output terminal 122 and the filter output bus bar 142b coupled to the output terminal 122, an output terminal upper part 122a is fixed to an output terminal lower part 122b fixed to the housing 101, by fastening a large screw 144 across the bus bar 142b. Accordingly, the output terminal 122 and the filter output bus bar are fixed to the projection 104 via an insulator 143. Due to a high-current output from the DC/DC converter device, the large screw 144 has a diameter large than the screw for fixing the step-up circuit section and the like to the housing. Although a torque will be generated by this large screw, the bus bar can withstand this torque.

In order to secure the performance of the capacitor 142a, a certain degree of size is required and a plurality of capacitors may be used. Moreover, there are many capacitors each having terminals on both sides, in the market. When coupled to the output terminal 122 and the housing 101 using such a capacitor, the connection position with the housing is likely to be far away from the output terminal and thus the area of a loop formed by the output terminal, the capacitor, the housing, and the wiring will increase. Then, the parasitic inductance of the filter circuit will increase, and the noise radiated from the power conversion circuit and propagating in space and/or the electromagnetic noise caused by an eddy current flowing in the housing might be superimposed on the filter circuit, so that the electromagnetic induction might degrade the filter performance.

In the embodiment, the connection position between the GND bus bar 142C and the housing 101 is set closer to the output terminal 122 than the capacitor 142a and the substrate 142d so as to reduce the loop. Accordingly, the parasitic inductance and electromagnetic induction can be reduced and the filtering function can be secured. Here, the position close to the output terminal 122 indicates the fact that the shortest distance to either one part of the output terminal 122 is small when viewed three-dimensionally.

Moreover, the filter output bus bar 142b and the GND bus bar 142C are arranged so as to face each other, so that the noise currents flowing into the filter circuit flow opposite to each other. As a result, a U-turn current is formed between the filter output bus bar and the GND bus bar. Accordingly, a magnetic flux generated in the periphery of the filter output bus bar and a magnetic flux generated in the periphery of the GND bus bar cancel out each other, so that a reduction in the parasitic inductance can be achieved.

Note that, as illustrated in FIG. 9, the connection position between the filter output bus bar 142b and the filter substrate 142d and the connection position between the GND bus bar 142C and the filter substrate 142d are on the same side of the filter substrate 142d. Thus, the both bus bars will be mounted facing each other until reaching a position where both bus bars are coupled to the substrate. Therefore, the superposition of noise and an increase of inductance can be prevented.

Moreover, the filter substrate 142d comprises two layers, wherein inner layer wirings of the substrate are mounted so as to face each other on the output side where the capacitor 142a is coupled to the filter output bus bar 142b and on the GND side where the capacitor 142a is coupled to the GND bus bar 142C. Thus, an increase in the parasitic inductance of the substrate pattern of the filter substrate 142d can be also prevented.

Note that, as the filter substrate 142d, a more-layer substrate instead of a two-layer substrate may be used. Because the use of a multilayer substrate can shorten the distance between layers to enhance the coupling between the output side and the GND side, an increase in the parasitic inductance can be further prevented.

The substrate 142d of the output filter is arranged so that the plane direction thereof is set along the longer direction of the output terminal 122. This is because arranging the substrate 142d so as to face a direction different from the direction of the substrate of the step-up circuit section 132 is more space-saving. In particular, as with the embodiment, the substrate 142d may be arranged perpendicular to the substrate of the step-up circuit 132 and the like so as to be set along the output terminal 122.

When the housing 101 includes the projection 104 projecting inward, the GND bus bar 142C may be coupled to the upper surface of the projection 104. Because the projection 104 has the through-hole 103 through which the output terminal 122 extends, the projection 104 can be coupled to a position close to the output terminal 122 and is also suitable for vertically placing the substrate 142d as illustrated in FIG. 9.

Moreover, as illustrated in FIG. 9, in the base plate 137, other than the shield wall 102 formed between the output filter 142 and the step-up circuit section 32, a shield wall 137a is formed for the purpose for separating the output filter 142 from the output terminal 122 and the output bus bar 121. Thus, without preparing a separate housing, the output filter 142 can be placed in a room substantially separated from the room of the step-down circuit section 131 and the step-up circuit section 132, so that the superposition of noise onto the filter substrate 142d can be reduced and a voltage with sufficiently reduced noise can be output from the DC/DC converter device.

OTHER EMBODIMENTS

Figure 10:
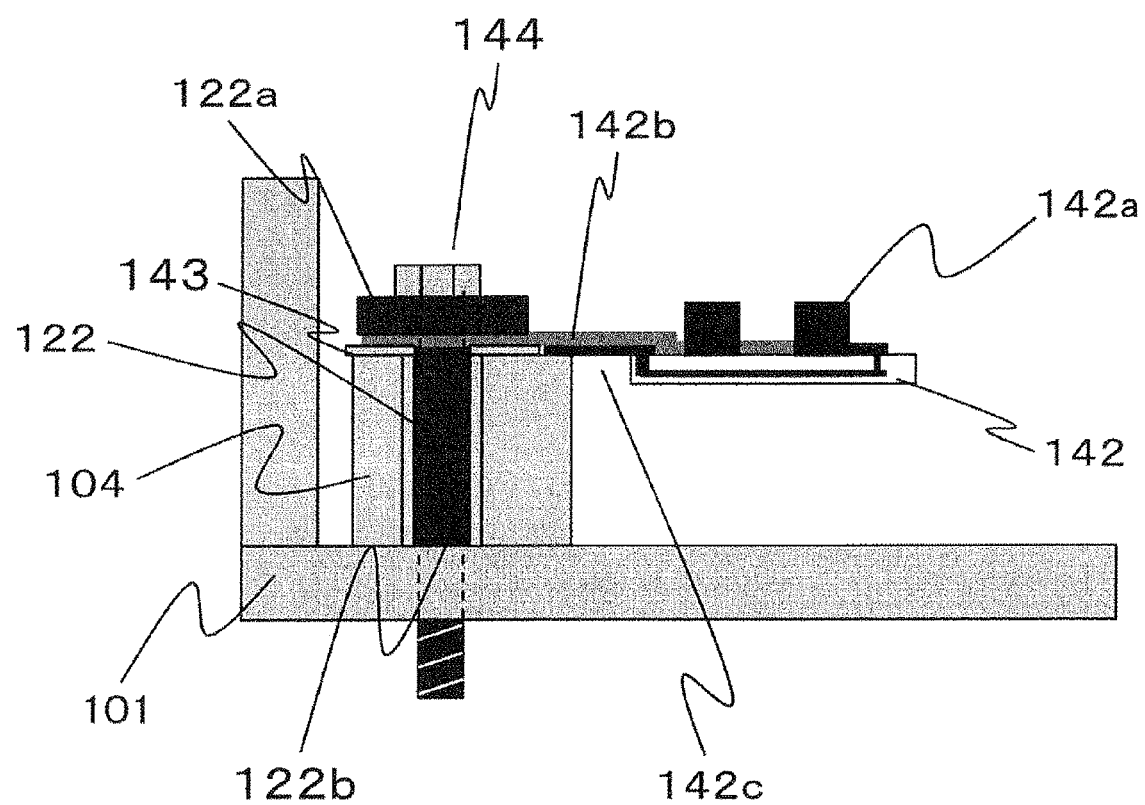
FIG. 10 is a cross sectional view illustrating the connection between an output filter and an output terminal 122 according to an alternative embodiment of the present invention.

The DC/DC converter device according to an aspect of the present invention can be modified to DC/DC converter devices according to various kinds of embodiments. For example, as illustrated in FIG. 10, the filter substrate 142d may be mounted in parallel to the housing bottom surface in accordance with the space of the housing. Also in this case, the connection portion between the GND bus bar 142d and the housing 101 is closer to the output terminal 122 than the capacitor 142a, and the loop is also reduced.

Moreover, the filter substrate 142d and the output terminal 122 may be directly coupled without via the filter output bus bar 142b and the GND bus bar 142C. The inductance corresponding to the filter output bus bar and the GND bus bar can be reduced and the filter substrate 142d can be mounted.

Note that, instead of mounting a ceramic capacitor onto the substrate, a filter capacitor integrated with the bus bar may be used. A filter output bus bar and a GND bus bar are caused to face each other and mounted integrally with a filter capacitor, so that the superposition of noise can be prevented, an increase in inductance can be also prevented, and the same effect as the effect obtained when a ceramic capacitor is used can be obtained.

Moreover, when the output power of the DC/DC converter device is small and the filter substrate 142d can withstand the torque of the large screw of the output terminal, the output terminal and the capacitor substrate 142 can be integrated. Therefore, the filter output bus bar 142b and the GND bus bar 142C may be omitted. Omission of the both bus bars enables to further reduce the parasitic inductance.

Note that, the above description is just exemplary, and is neither limited to nor constrained from the correspondence between the contents of the above-described embodiments and the contents of the claims at all in interpreting the invention. For example, in the above-described embodiments, the LV side of the DC/DC converter has been taken as an example and described, but the present invention may be applied to the HV side. Moreover, a power conversion device mounted in vehicles, such as PHEV or EV, has been described as an example, but the present invention is not limited thereto and can be also applied to the power conversion devices used for construction machinery and the like, and the vehicles of a railroad, and furthermore can be also applied to electronic devices other than the power conversion devices.

REFERENCE SIGNS LIST

100: DC/DC converter device
101: housing
102: shield wall
103: through-hole
104: projection
105: GND boss
105a: GND boss installing hole
111: top cover
121: output bus bar
122: output terminal
123: bus bar
124: GND bus bar
130: control circuit substrate
131: step-down circuit section
132: step-up circuit section
133: main transformer
134: inductor element for voltage conversion
135: power semiconductor module
136: switching elements H1-H4
137: base plate
137a: shield wall
141: ferrite core
142: output filter
142a: ceramic capacitor
142b: filter output bus bar
142C: GND bus bar
142d: output filter substrate
143: insulator
144: large screw

The invention claimed is:

1. An electronic device comprising;
a housing;
a circuit board provided in the housing; and
an external terminal for outputting an output of the circuit board to an outside or for entering the circuit board from an outside, the external terminal extending through a through-hole provided in the housing, the electronic device further comprising:
a filter unit with a filter capacitor;
a first bus bar for coupling the external terminal and the filter unit; and
a second bus bar for coupling the housing and the filter unit, wherein the second bus bar is a GND bus bar that is electrically connected to the housing at a position closer to the external terminal than the filter unit.

2. The electronic device according to claim 1, wherein at least a part of the second bus bar and at least a part of the first bus bar are arranged facing each other.

3. The electronic device according to claim 1, wherein the filter unit includes a substrate with a bus bar and a filter capacitor mounted on the substrate and electrically connected to the bus bar of the substrate, and wherein the first bus bar and the second bus bar are electrically connected to the bus bar of the substrate on a same side with respect to the filter capacitor in a plane direction of the substrate.

4. The electronic device according to claim 3, wherein a part of the first bus bar and a part of the second bus bar are wired so as to face the bus bar of the substrate.

5. The electronic device according to claim 3, wherein in the bus bar of the substrate, a bus bar for coupling the filter capacitor and the first bus bar and a bus bar for coupling the filter capacitor and the second bus bar are provided so as to face each other.

6. The electronic device according to claim 3, wherein a surface of the circuit board and a surface of the substrate of the filter unit each face a different direction.

7. The electronic device according to claim 1, wherein the first bus bar is a filter output bus bar.

8. The electronic device according to claim 1, wherein a shield unit is provided between the filter unit and the circuit board.

9. The electronic device according to claim 1, wherein the external terminal is fixed to the housing with a screw having a diameter larger than a screw for fixing the circuit board to the housing.

10. The electronic device according to claim 1, wherein the circuit board includes a power conversion circuit for converting electric power.

11. An electronic device comprising;
a housing;
a circuit board provided in the housing; and
an external terminal for outputting an output of the circuit board to an outside or for entering the circuit board from an outside, the external terminal extending through a through-hole provided in the housing, wherein the electronic device further comprising;
a filter unit with a capacitor;
a first bus bar for coupling the external terminal and the filter unit; and
a second bus bar for coupling the housing and the filter unit, wherein
a housing in a periphery of the through-hole forms a projection that projects toward an inside of the housing from a surface having the circuit board of the housing installed therein, and wherein
the second bus bar is a GND bus bar that is electrically connected to the housing via the projection.

12. An electronic device comprising:
a housing;
a circuit board;
an external terminal for outputting an output of the circuit board to an outside or for entering the circuit board from an outside, the external terminal extending through a through-hole provided in the housing; and
a filter unit with a filter capacitor, the filter unit being electrically connected to the external terminal and GND, wherein the circuit board and the filter unit include:
a shield unit provided inside the housing, provided between the circuit board and the external terminal as well as the filter unit and configured to shield electromagnetic waves;
a first bus bar bypassing the shield unit and electrically coupling the circuit board to the external terminal and the filter unit; and
a second bus bar for coupling the housing and the filter unit, wherein the second bus bar is a GND bus bar that is electrically connected to the housing.

13. The electronic device according to claim 12, wherein the circuit board is a power conversion substrate for converting electric power.

14. The electronic device according to claim 13, wherein the power conversion substrate includes a switching element and a diode.

15. The electronic device according to claim 12, including a ferrite core on the bus bar, wherein the shield unit is provided between the ferrite core and the circuit board.

16. The electronic device according to claim 15, including, on the circuit board, a smoothing capacitor electrically connected to GND, wherein the smoothing capacitor, the ferrite core, and the filter unit constitute a π-type LC filter.

17. The electronic device according to claim 12, wherein the shield unit is a shield wall integrally formed with the housing.

18. The electronic device according to claim 12, including a base plate, wherein the circuit board and the external terminal are provided between the housing and the base plate, and wherein the shield unit is a shield wall integrally formed with the base plate.

19. The electronic device according to claim 12, including a shield unit between the external terminal and the filter unit.

* * * * *